United States Patent
Ordentlich et al.

(10) Patent No.: US 10,320,420 B2
(45) Date of Patent: Jun. 11, 2019

(54) BIT-FLIP CODING

(71) Applicant: Hewlett Packard Enterprise Development LP, Houston, TX (US)

(72) Inventors: Erik Ordentlich, San Jose, CA (US); Ron M. Roth, Palo Alto, CA (US)

(73) Assignee: Hewlett-Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/112,013

(22) PCT Filed: Jan. 24, 2014

(86) PCT No.: PCT/US2014/013062
§ 371 (c)(1),
(2) Date: Jul. 15, 2016

(87) PCT Pub. No.: WO2015/112167
PCT Pub. Date: Jul. 30, 2015

(65) Prior Publication Data
US 2016/0352358 A1     Dec. 1, 2016

(51) Int. Cl.
*H03M 13/15*   (2006.01)
*H03M 13/29*   (2006.01)
*H03M 13/47*   (2006.01)
*H03M 13/51*   (2006.01)
*G06F 11/10*   (2006.01)
(Continued)

(52) U.S. Cl.
CPC ..... *H03M 13/1575* (2013.01); *G06F 11/1068* (2013.01); *G11C 29/52* (2013.01); *H03M 13/2921* (2013.01); *H03M 13/47* (2013.01); *H03M 13/51* (2013.01)

(58) Field of Classification Search
CPC ......... H03M 13/1575; H03M 13/2921; H03M 13/47; H03M 13/51; G06F 11/1068; G11C 29/52
See application file for complete search history.

(56) References Cited

U.S. PATENT DOCUMENTS 2,632,058 A     3/1953   Gray
4,979,174 A *  12/1990  Cheng ................... H04L 1/004
                                                              714/774
(Continued)

FOREIGN PATENT DOCUMENTS

EP    1611494 B1    10/2013

OTHER PUBLICATIONS

Hadi Hajimiri et al., "Content-aware Encoding for Improving Energy Efficiency in Multi-Level Cell Resistive Random Access Memory," 2013 IEEE/ACM International Symposium on Nanoscale Architectures (NANOARCH), Jul. 2013, pp. 76-81.
(Continued)

*Primary Examiner* — April Y Blair
*Assistant Examiner* — Dipakkumar B Gandhi
(74) *Attorney, Agent, or Firm* — Trop, Pruner & Hu, P.C.

(57) ABSTRACT

Bit-flip coding uses a bit-flip encoder to flip bits in a redundancy-intersecting vector of a binary array having n rows and n columns until Hamming weights of the binary array are within a predetermined range Δ of n divided by two. Information bits of an input data word to the bit-flip coding apparatus are stored in locations within the binary array that are not occupied by n redundancy bits of a redundancy vector.

18 Claims, 4 Drawing Sheets

(51) Int. Cl.
*G11C 29/52* (2006.01)
*H03M 13/53* (2006.01)

(56) References Cited

U.S. PATENT DOCUMENTS

| | | | |
|---|---|---|---|
| 5,579,475 A | 11/1996 | Blaum et al. | |
| 6,175,317 B1 | 1/2001 | Ordentlich et al. | |
| 6,556,151 B1 * | 4/2003 | Smeets | H03M 7/40 341/65 |
| 7,859,884 B2 | 12/2010 | Scheuerlein | |
| 7,885,094 B2 | 2/2011 | Min et al. | |
| 8,621,317 B1 | 12/2013 | Cypher | |
| 2002/0014980 A1 * | 2/2002 | Rub | H03M 7/00 341/59 |
| 2008/0049481 A1 | 2/2008 | Hanzaiva et al. | |
| 2008/0089110 A1 | 4/2008 | Robinett et al. | |
| 2008/0266941 A1 | 10/2008 | Lee et al. | |
| 2009/0003040 A1 | 1/2009 | Stan et al. | |
| 2010/0034015 A1 | 2/2010 | Tsuji | |
| 2010/0235714 A1 | 9/2010 | Toda | |
| 2012/0013491 A1 | 1/2012 | Chen et al. | |
| 2012/0031491 A1 | 2/2012 | Walukiewicz et al. | |
| 2012/0069622 A1 | 3/2012 | Parkinson et al. | |
| 2012/0221775 A1 | 8/2012 | Kim et al. | |
| 2013/0097396 A1 | 4/2013 | Ordentlich et al. | |
| 2013/0262759 A1 | 10/2013 | Ordentlich et al. | |
| 2013/0311857 A1 | 11/2013 | Murakami | |

OTHER PUBLICATIONS

PCT International Search Report & Written Opinion, dated Oct. 27, 2014, PCT Patent Application No. PCT/US2014/013062, 10 pages.
Canfield, Asymptotic Enumeration of Dense 0-1 Matrices with Equal Row Sums and Equal Column Sums, The Electronic Journal of Combinatorics 12 (2005) (31 pages).
Hoeffding, Wassily, Probability Inequalities for sums of bounded random variables, Contract No. AF(638)-261, May 1962 (25 pages).
Motwani et al., Randomized Algorithms:, 1995 (488 pages).
Ordentlich et al., Low Complexity Two-Dimensional Weight-Constrained Codes, 2011 (8 pages).
Ordentlich et al., Two-Dimensional Weight-Constrained Codes through Enumeration Bounds, Feb. 17, 2000 (23 pages).
Talyansky et al., Efficient Code Constructions for Certain Two-Dimensional Constraints, IEEE Transactions on Information Theory. vol. 45, No. 2, Mar. 1999 (7 pages).
Etzion, T. et al, "Zero/positive capacities of two-dimensional runlength-constrained arrays", Information Theory, IEEE Transactions on 51, No. 9 (2005): 3186-3199.
Roth, Ronald M., et al. "Efficient coding to a two-dimensional runlength-limited constraint." In Proc. of the SPIE—The Intl. Soc. for Optical Engineering, vol. 3802, pp. 8-17. 1999.
The International Search Report and the Written Opinion of the International Searching Authority; dated Mar. 25, 2011; Application PCT/US2010/040321; Filed Jun. 29, 2010.

* cited by examiner

US 10,320,420 B2

BIT-FLIP CODING

CROSS-REFERENCE TO RELATED APPLICATIONS

N/A

STATEMENT REGARDING FEDERALLY SPONSORED RESEARCH OR DEVELOPMENT

N/A

BACKGROUND

Binary data coding, also referred to as simply 'binary coding,' is a mapping of a plurality of information bits of a data word into a format that provides an improved result when one or more of storing, processing and transmitting the data word. For example, the Gray code developed and patented by Frank Gray of Bell Labs in 1947 (U.S. Pat. No. 2,632,058) is a binary data code based on a binary numbering system having successive values that differ from one another by a single bit. The Gray code is useful in a variety of applications in which changes from one binary value to another may be misinterpreted or produce errors if an un-coded or 'straight' binary representation of data were to be used. For example, Gray codes are used in a wide variety of applications including, but not limited to, error correction (e.g., in digital communication), position encoders (e.g., rotary encoders), digital counters, and even genetic algorithms. Other binary data codes including, but not limited to, various error-correction codes (ECCs), introduce redundancy to enable bit errors to be detected and, in some instances, corrected. ECCs of various forms are used extensively in data communication and data storage in which various random error processes may introduce bit errors in data being one or more of handled, processed, transmitted and stored. In yet other examples, binary codes are used to configure data in a manner that reduces a chance that bit errors may be produced by a system that one or more of handles, processes, transmits and stores the data.

BRIEF DESCRIPTION OF THE DRAWINGS

Various features of examples in accordance with the principles described herein may be more readily understood with reference to the following detailed description taken in conjunction with the accompanying drawings, where like reference numerals designate like structural elements, and in which.

Figure 1A:
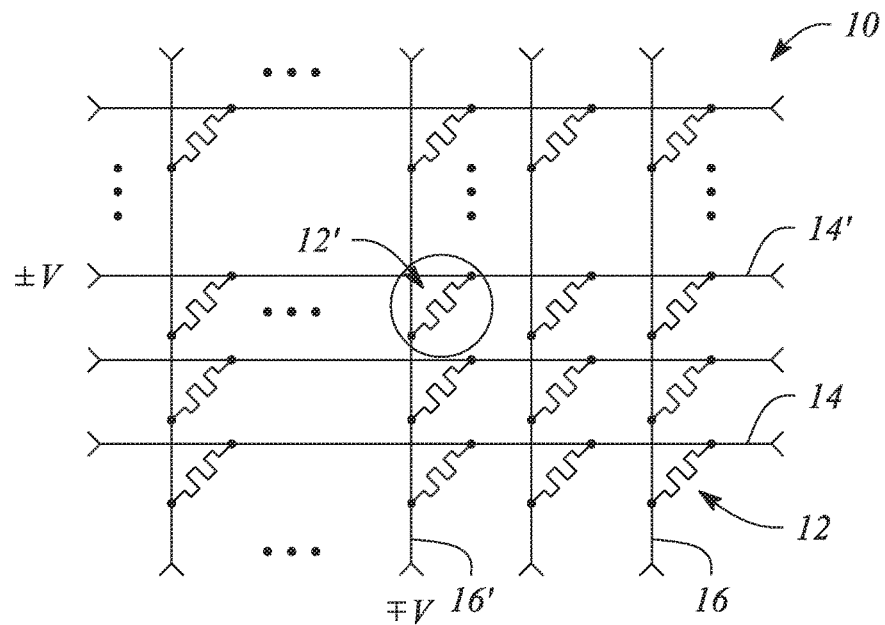
FIG. 1A illustrates a schematic diagram of a resistive crossbar memory array, according to an example of the principles described herein.

Certain examples have other features that are one of in addition to and in lieu of the features illustrated in the above-referenced figures. These and other features are detailed below with reference to the above-referenced figures.

DETAILED DESCRIPTION

Examples in accordance with the principles described herein provide bit-flip coding of a data word into a binary array. In particular, bit-flip coding as described herein is a binary data coding that may be used to code information bits of an input data word mapped into a binary array to meet a row-column Hamming weight condition. The row-column Hamming weight condition is met by performing a series of bit-flip operations on vectors within the binary array, according to the principles described herein. Redundancy bits in the binary array track the bit-flip operations to facilitate decoding of the information bits. Once coded by the bit-flip coding described herein, the information bits of the data word become less susceptible to errors that may be introduced in certain applications. In particular, the bit-flip coding described herein may reduce bit errors that may be introduced when writing data to a resistive crossbar memory array in which unselected row and column lines are allowed to float, according to some examples.

Herein an 'array' is defined as a collection of elements u generally arranged in rows and columns. Rows and columns of an array may be indexed using indices (e.g., i,j, etc.) such that an array element $u_{i,j}$ in a first row (e.g., i=1) and a first column (e.g., j=1) may be designated as '$u_{1,1}$.' Similarly, an array element located in a fifth position in a second row may be designated '$u_{2,5}$.' Note that rows and columns of an array intersect so that a fifth position in a second row corresponds to a second position in a fifth column, by definition.

Herein, a 'binary' array, by definition, is an array having binary elements (i.e., elements having a binary value (e.g., $u_{i,j} \in \{1,0\}$)). A 'square' array is an array having an equal number of elements u in each row and each column. A square array having rows and columns with n elements is an n by n or 'n×n' array, by definition herein.

Further by definition herein, a 'vector' is a one-dimensional (1-D) array. A vector may be a row or a column, for example. In another example, a vector may be a diagonal (e.g., a major diagonal) of an array. For an n×n array, a 'major' diagonal D is a diagonal running from atop left corner to a lower right corner has n elements $u_{i,j}$ (i.e., $D=(u_{1,1}, u_{2,2}, u_{3,3}, \ldots, u_{n,n})$). By definition herein, a 'generalized' diagonal D* of an n×n array is a diagonal starting at any position in a first row (or first column) and extending to a last row (or last column), and then continuing from a corresponding location in the last row (or last column) to the first row (or first column) that provides a total of n elements u. For example, a set of generalized diagonals D* extending down to the right from a first row of an n×n array includes elements in all positions that are indexed by $\{i, i+d\}$ for i=1 to n, where $d \in \{0, 1, 2, \ldots, n-1\}$ and indexes are wrapped around modulo n (e.g., i+d=n+1 is read as 1).

Herein, a 'Hamming weight' or 'w' of a vector in a binary array is defined as the number of 1's in the vector. As such, a row of a binary array A having twenty-five 1's has a Hamming weight w of twenty-five (w=25). Similarly, a column of the binary array A with thirteen 1's has a Hamming weight w of thirteen (w=13).

Herein, a 'redundancy' vector is defined as a vector in an array where the vector has elements whose values are determined by the coding scheme from the values of other elements of the array. In particular, the elements of a redundancy vector can have predetermined or known values. The redundancy vector may be used to record changes made to the array as represented by changes in the element values relative to the predetermined values. For example, a redundancy vector of a binary array may be a vector (e.g., a diagonal, a row or a column) that is filled with all 0's. In another example, the redundancy vector may be filled with all 1's. In yet another example, a known pattern of 1's and 0's (e.g., 1,0,1,0, . . . ) may be used as the predetermined element values of the redundancy vector. A change to one or more of the predetermined element values of the redundancy vector (e.g., 1→0 or 0→1) may be used to recognize and even undo (e.g., decode) a modification that may have been made to the array, according to some examples.

Further by definition herein, a 'redundancy-intersecting vector' in an array is a vector that intersects a redundancy vector of the array. In particular, a redundancy-intersecting vector may cross or intersect the redundancy vector at a single location. Moreover, two different redundancy-intersecting vectors may intersect the redundancy vector at different, unique locations along the redundancy vector. In particular, in some examples, the redundancy vector may be a row or a column of an n×n binary array A. Each generalized diagonal $D^*_i$ of a set of generalized diagonals $D^*$ in the n×n binary array A intersects the redundancy vector at a single location. As such, each of the generalized diagonals $D^*_i$ of the n×n binary array A are redundancy-intersecting vectors. In other examples, the redundancy vector is a diagonal (e.g., a major diagonal) of the n×n binary array A. In these examples, the redundancy-intersecting vector may be a row or a column of the n×n binary array A. In particular, in some examples, an i-th row in combination with an i-th column is defined as an i-th redundancy-intersecting vector for a redundancy vector that is a major diagonal of an n×n binary array A. Note that both the i-th row and the i-th column intersect the major diagonal (i.e., the redundancy vector) at a single location or element u (e.g., at $u_{i,i}$ for the major diagonal ($u_{1,1}, u_{2,2}, \ldots, u_{n,n}$).

Herein, 'flipping' bits is defined as changing of a binary bit from a first value to a corresponding second value. In particular, flipping bits in a binary vector changes each bit having a value of zero to a value of one (e.g., 0→1) and each bit having a value of one to a value of zero (e.g., 1→0) within the binary vector. For example, bit flipping a binary vector (1, 0, 0, 1, 1, 0) would produce the corresponding 'flipped' binary vector (0, 1, 1, 0, 0, 1), in accordance with the definition of 'flipping' bits used herein.

In some examples, bit-flip coding according to the principles herein may be used to code data for storage in a resistive crossbar memory array. In particular, the bit-flip coding described herein may reduce bit errors (e.g., programming or 'write' errors) that may occur in resistive crossbar memory arrays without the bit-flip coding. Herein, a 'resistive' crossbar memory array is defined as a plurality of resistive memory elements arranged in a crossbar array configuration. A crossbar array is an array of memory elements having a plurality of row lines and substantially perpendicular column lines for selecting individual memory elements. For example, a particular memory element may be selected by asserting a particular row line and a particular column line that connect to the particular memory element. A resistive memory element is a non-volatile memory element that stores data by a change in a resistance. Examples of resistive memory elements include, but are not limited to, phase change chalcogenides, binary transition metal oxides, certain solid-state electrolytes, and various perovskites. Resistive crossbar memory arrays include, but are not limited to, memristor arrays and resistive random access memory (ReRAM).

FIG. 1A illustrates a schematic diagram of a resistive crossbar memory array 10, according to an example of the principles described herein. As illustrated, the resistive crossbar memory array includes a plurality of resistive memory elements 12. Each resistive memory element 12 is connected to a row line 14 and a column line 16. Moreover, each resistive memory element 12 may be accessed by a specific pair or combination of row and column lines 14, 16, as illustrated. By way of example, a particular resistive memory element 12' is accessed or selected by a specific pair of row and column lines 14', 16' (i.e., the 'selected' row and column lines) as indicated by a circle in FIG. 1A. The particular resistive memory element 12' may be accessed or selected during a 'write' operation to change a state of (i.e., to program) the particular resistive memory element 12', for example.

Figure 1B:
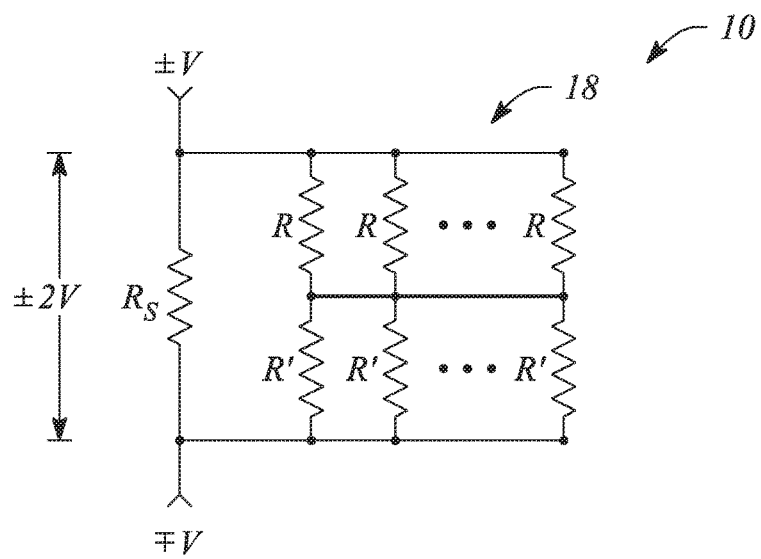
FIG. 1B illustrates a schematic diagram of the resistive crossbar memory array of FIG. 1A during a write operation, according to an example of the principles describe herein.

FIG. 1B illustrates a schematic diagram of the resistive crossbar memory array 10 of FIG. 1A during a write operation, according to an example of the principles describe herein. In particular, FIG. 1B illustrates an approximation of the resistive crossbar memory array 10 in terms of resistances of the resistive memory elements 12 in FIG. 1A. As illustrated, a resistance of the particular or 'selected' resistive memory element 12' of FIG. 1A is denoted by $R_s$ in FIG. 1B, while R and R' represent resistances associated with other unselected resistive memory elements 12 of FIG. 1A connected respectively to either the row line 14' or column line 16' of the specific pair. The schematic diagram of FIG. 1B is an approximation in that conductors and resistive memory elements 12 that are not in a row or column of the selected row and column lines 14', 16' are 'collapsed' as an 'approximate' short represented by a bold line between the sets of resistances R and R', as illustrated.

During the write operation, the specific pair of row and column lines 14', 16' connected to the selected resistive memory element 12' (e.g., denoted by $R_s$ in FIG. 1B) is asserted by connecting the specific pair to appropriate drive voltages (e.g., ±V and ∓V, respectively), as illustrated. In particular, the selected resistive memory element 12' may be switched to or placed in an 'ON' state during the write operation when the threshold voltage of about ±2V (e.g., +V minus ∓V) is applied across the selected resistive memory element 12' (i.e., $R_s$), according to some examples. The ON state may arbitrarily represent a first bit value of one (1), while an OFF state may arbitrarily represent a second bit value (e.g., zero or '0'), for example. All other row and column lines 14, 16 (i.e., the 'unselected' lines) are allowed to float during the write operation, according to various examples. As such, the other unselected row and column lines 14, 16 interconnect various other 'unselected' resistive memory elements 12 (i.e., those resistive memory elements not being written to) to form a parallel resistor network 18, represented by resistors denoted by R and R' as illustrated in FIG. 1B. The parallel resistor network 18, may interfere with programming or writing to the particular resistive memory element 12' (i.e., $R_s$ in FIG. 1B). In particular, for an arbitrary bit configuration stored in the resistive crossbar memory array 10, voltages across one or more of the resistive memory elements 12 of the parallel resistor network 18 may exceed a voltage threshold for producing a change of state during a write operation for the selected resistive memory element 12'.

Bit-flip coding according to the principles described herein may reduce or, in some examples, eliminate state change errors that may be introduced in the resistive crossbar memory array 10 due to the presence of the parallel resistor network 18. In particular, bit-flip coding as described herein may provide a bit configuration for data stored within the resistive crossbar memory array 10 in which about half of the unselected resistive memory elements 12 during a write operation are in an 'ON' state (e.g., have a bit value of 1). If about half of the unselected resistive memory elements 12 that make up the parallel resistor network 18 are 'ON', then a voltage across any of these unselected memory elements 12 will be limited to about ±V when ±2V is applied to write to the selected resistive memory element 12'. Since ±V is much less than the threshold voltage (e.g., about ±2V) used to program or write to a given resistive memory element 12, bit-flip coding may reduce or even eliminate bit errors in the resistive crossbar memory array 10 due to writing to selected resistive memory elements 12', according to various examples of the principles described herein.

Further, as used herein, the article 'a' is intended to have its ordinary meaning in the patent arts, namely 'one or more' and may be used interchangeably therewith. For example, 'a row' means one or more rows and as such, 'the row' means 'the row(s)' herein. Also, any reference herein to 'top', 'bottom', 'upper', 'lower', 'up', 'down', 'front', back', 'left' or 'right' is not intended to be a limitation herein. Herein, the term 'about' when applied to a value generally means within the tolerance range of the equipment used to produce the value, or in some examples, means plus or minus 10%, or plus or minus 5%, or plus or minus 1%, unless otherwise expressly specified. Further, herein the term 'substantially' as used herein means a majority, or almost all, or all, or an amount with a range of about 51% to about 100%, for example. Moreover, examples herein are intended to be illustrative only and are presented for discussion purposes and not by way of limitation.

Figure 2:
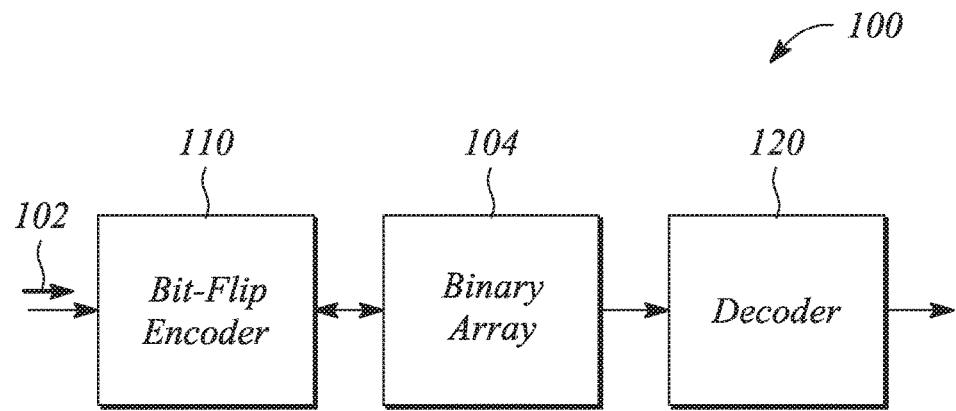
FIG. 2 illustrates a block diagram of a bit-flip coding apparatus, according to an example of the principles describe herein.

FIG. 2 illustrates a block diagram of a bit-flip coding apparatus 100, according to an example of the principles describe herein. The bit-flip coding apparatus 100 receives a data word 102 as an input and then encodes information bits of the received data word 102. The bit-flip coding apparatus 100 produces a binary array 104 containing the encoded information bits. The binary array 104 containing the encoded bits may be stored in a computer memory (e.g., a resistive crossbar memory array). According to various examples, the information bits of the data word 102 are initially stored in locations within the binary array 104 that are not occupied by redundancy bits of a redundancy vector of the binary array 104.

The redundancy vector of the binary array 104 includes a plurality of redundancy bits. Prior to encoding, each of the redundancy bits of the redundancy vector has a predetermined value (e.g., all 0's, all 1', etc.). Following the encoding of the information bits, the redundancy bits of the redundancy vector provide decoding information that may be used to decode the encoded information bits produced by the bit-flip coding apparatus 100, according to various examples. The decoding information may be a difference between a redundancy bit value after encoding and a predetermined value of the redundancy bit, for example.

According to various examples, the binary array 104 with the encoded information bits produced by the bit-flip coding apparatus 100 meets or is bounded by a row-column Hamming weight condition. In particular, the information bits of the received data word 102 along with the redundancy bits of the redundancy vector are encoded by the bit-flip coding apparatus 100 in a manner that produces a Hamming weight of each of the rows and the columns of the binary array 104 that is within a predetermined range Δ of one half of a number of elements in the respective rows and columns (i.e., the row-column Hamming weight condition). The row-column Hamming weight condition may be chosen to ensure that a number of ones (1's) in any row or column is about equal to one half, for example. As such, there will be about as many 1's as there are zeros (0's) in each row and each column of the binary array 104 when the row-column Hamming weight condition is achieved, according to various examples.

For example, the binary array 104 may be a square array having n rows and n columns (i.e., the binary array is an n×n binary array). As such, each row and each column has n elements, by definition. The row-column Hamming weight condition may be defined as a Hamming weight of each row and of each column of the binary array that falls within ± the predetermined range Δ of n/2, for example. Accordingly, the Hamming weights of all of the rows as well as the Hamming weights of all of the columns of the binary array 104 are within the predetermined range Δ of n divided by two when the Hamming weight condition is met.

According to various examples, the predetermined range Δ is non-negative and a member of a set of a number of elements in the rows and the columns divided by two plus an integer. For example, for the n×n binary array 104 having rows and columns with n elements, the predetermined range $\Delta \in (n/2)+Z$, where Z is the set of non-negative integers ($Z=\{0, 1, 2, \ldots\}$). In some examples, the predetermined range Δ should satisfy the inequality given by equation (1) as $$\Delta \geq \sqrt{(n/2)\ln(4n/p)} - 1 \qquad (1)$$

where p is a fixed value $p \in (0,1)$, n is defined above, and ln(·) is a natural logarithm. Equation (1) is from a union bound $$\mathrm{Prob}\{A \notin A_n(\Delta)\} \leq 2n \cdot 2^{-n} \cdot \sum_{i : |i - n/2| > \Delta} \binom{n}{i} \leq 4n \cdot e^{-2(\Delta+1)^2/n}$$

where A is a binary array (e.g., binary array 104), $A_n(\Delta)$ is a set of binary arrays in which the row and column Hamming weights are within the predetermined range Δ of n/2, e is the base of natural logarithms, $$\binom{n}{i}$$

represents the binomial coefficient 'n-choose-i', and the right-hand inequality follows from the Chernoff-Hoeffding inequality (e.g., see W. Hoeffding, "Probability inequalities for sums of bounded random variables," *J. Amer. Statist. Assoc.*, 58 (1963), pp. 13-30)).

As illustrated in FIG. 2, the bit-flip coding apparatus 100 comprises a bit-flip encoder 110. The bit-flip encoder 110 is configured to flip bits in a (i.e., one or more) redundancy-intersecting vector of the binary array 104. According to various examples, the bit-flip encoder 110 flips bits in the redundancy-intersecting vectors until all Hamming weights of the various rows and columns of the binary array 104 are within the predetermined range Δ of n divided by two (i.e., n/2). In particular, a redundancy-intersecting vector is selected and then the bits in the selected redundancy-intersecting vector are flipped. According to various examples, all of the bits in the selected redundancy-intersecting vector are flipped (i.e., 0→1 and 1→0 ∀ bits). The bit-flip encoder 110 continues flipping bits until the Hamming weights of the rows and columns are within the predetermined range Δ of n/2. When the Hamming weights are within the predetermined range Δ of n/2, then the binary array 104 is said to 'meet' the row-column Hamming weight condition, by definition herein. In particular, when a particular binary array A (e.g., binary array 104) meets the row-column Hamming weight condition, then the binary array A is a member of the set of binary arrays $A_n(\Delta)$ (i.e., $A \in A_n(\Delta)$).

For example, the bit-flip encoder 110 may flip all of the bits in a first redundancy-intersecting vector and if the row-column Hamming weight condition is met, then the bit-flip encoder 110 stops flipping bits. Alternatively, if the row-column Hamming weight condition is not met, the bit-flip encoder 110 may flip bits in a second redundancy-intersecting vector, a third redundancy-intersecting vector, and so on until the row-column Hamming condition is met. In particular, bit flipping of bits in successive redundancy-intersecting vectors may continue until the binary array 104 meets the row-column Hamming weight condition, according to various examples.

In some examples, the redundancy-intersecting vector includes both a row and a corresponding column of the binary array 104, and the redundancy vector is a diagonal of the binary array 104. By definition, the 'corresponding' column is a column of the binary array 104 having an element in common with the row at an intersection point with the redundancy vector. In particular, for an i-th row, the i-th column is the 'corresponding' column since both the i-th row and the i-th column intersect the diagonal at the same element. For example, if the diagonal is a major diagonal $D=(u_{1,1}, u_{2,2} \ldots)$, then both the i-th row and the i-th column intersect the major diagonal D at the i-th element $u_{i,i}$ thereof. In other examples, the redundancy-intersecting vector is or includes a generalized diagonal of the binary array 104. In these examples, the redundancy vector may be a row or a column of the binary array 104. Other combinations of redundancy vector and redundancy-intersecting vectors may be devised without departing from the scope described herein.

Figure 3A:
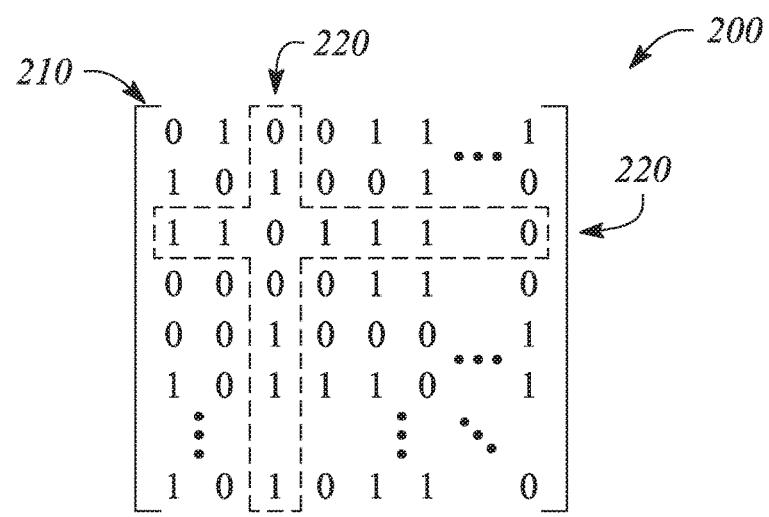
FIG. 3A illustrates a binary array, according to an example consistent with the principles described herein.

FIG. 3A illustrates a binary array 200, according to an example consistent with the principles described herein. In particular, FIG. 3A illustrates a binary array 200 having n rows and n columns (i.e., as an n×n binary array). The binary array 200 includes a redundancy vector 210 located along a major diagonal in the binary array 200. Information bits of a data word stored in the binary array 200 are illustrated in 'off-diagonal' locations within the binary array 200. FIG. 3A also illustrates a redundancy-intersecting vector 220. Specifically illustrated is an i-th redundancy-intersecting vector 220 that includes an i-th row and an i-th column (i.e., a 'corresponding' column) of the binary array 200. The redundancy-intersecting vector 220 is outlined by dashed line in FIG. 3A to emphasize inclusion of both the i-th row and the i-th column within the redundancy-intersecting vector 220. As illustrated, the binary array 200 may be in a state prior to bit flipping by the bit-flip encoder 110 with the predetermined values of bits of the redundancy vector 210 being zero, for example.

Figure 3B:
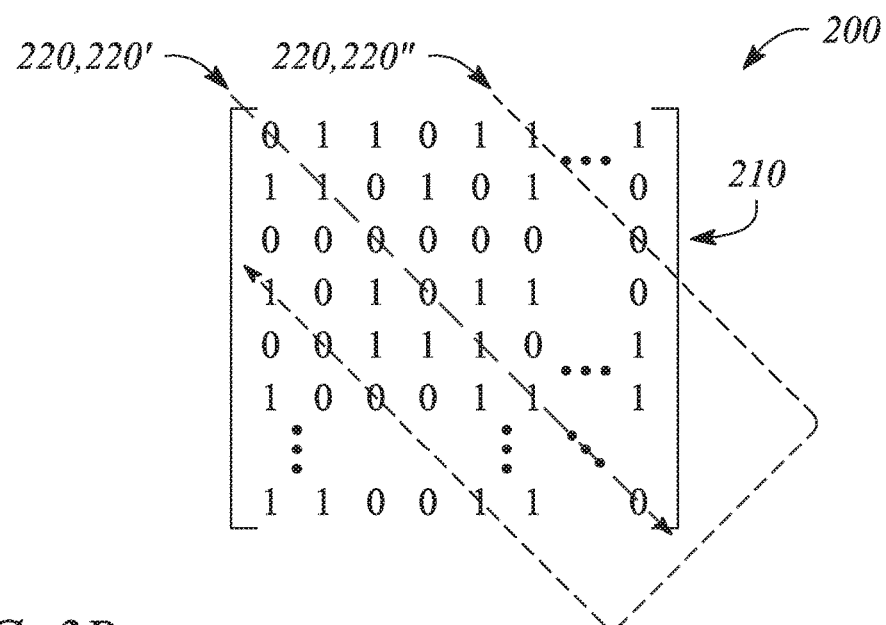
FIG. 3B illustrates a binary array, according to another example consistent with the principles described herein.

FIG. 3B illustrates a binary array 200, according to another example consistent with the principles described herein. In particular, the binary array 200 illustrated in FIG. 3B is an n×n binary array that includes a redundancy vector 210 as a row (e.g., an i-th row where i=3) and a redundancy-intersecting vector 220 as a generalized diagonal of the binary array 200. As illustrated, a first redundancy-intersecting vector 220' and a second redundancy-intersecting vector 220" are indicated by dashed lines passing through respective elements thereof in FIG. 3B. The binary array 200 illustrated in FIG. 3B may be in a state before bit flipping by the bit-flip encoder 110 with the n-bits of the redundancy vector 210 each having a predetermined value of zero (0), for example. According to some examples, the binary array 200 may be produced by a bit mapper that maps information bits of an input data word (e.g., the data word 102 of FIG. 2) into the binary array 200, for example. The binary array 200 may be substantially similar to the binary array 104 described above with respect to the bit-flip coding apparatus 100, according to some examples.

Figure 3C:
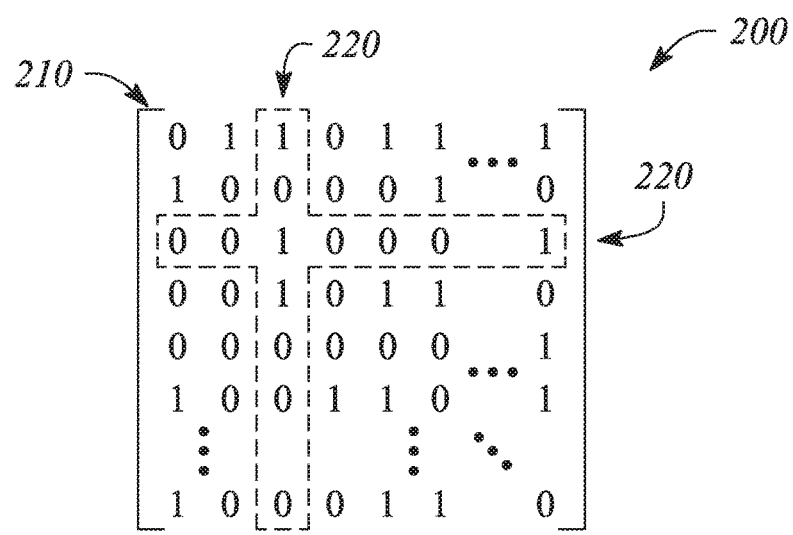
FIG. 3C illustrates the binary array of FIG. 3A following bit flipping, according to an example consistent with the principles described herein.

FIG. 3C illustrates the binary array of FIG. 3A following bit flipping, according to an example consistent with the principles described herein. In particular, as illustrated in FIG. 3C, bits of the i-th redundancy-intersecting vector 220 that includes an i-th row and an i-th column have been flipped relative to the binary array 200 illustrated in FIG. 3A. The bits may have been flipped by the bit-flip encoder 110, for example. Note that a bit of the redundancy vector 210 at position (i, i) has been flipped along with all other bits in the redundancy-intersecting vector 220, as illustrated in FIG. 3C. Flipping of the redundancy vector bit may facilitate decoding the binary array 200 following encoding by the bit-flip encoder 110, for example.

According to some examples, the bit-flip encoder 110 may be a randomized bit-flip encoder 110. In particular, the bit-flip encoder 110 may be configured to randomly select the redundancy-intersecting vector and then to flip the bits of the randomly selected redundancy-intersecting vector. The randomized bit-flip encoder 110 is further configured to compute a Hamming weight of each of the rows and columns of the binary array to determine if the row-column Hamming weight condition has been met. In some examples, the randomized bit-flip encoder 110 randomly selects a single redundancy-intersecting vector for bit flipping. In other examples, the randomized bit-flip encoder 110 selects a plurality of redundancy-intersecting vectors.

In particular, in some examples, the randomized bit-flip encoder 110 selects a random, binary word having a uniform distribution. For example, the randomized bit-flip encoder 110 may select a n-bit binary word $(x_1, x_2, \ldots, x_n)$ where each $x_i \in \{0,1\}$ and uniformly distributed over $\{0,1\}^n$. Then, for each i taken in increasing order where $x_i$ of the n-bit binary word is equal to one (i.e., for i=1, . . . , n such that $x_i=1$), the encoder flips all the bits in the i-th redundancy-intersecting vector of the binary array. For example, if the redundancy-intersecting vector includes an i-th row and an i-th column of the binary array 104, then for each i where $x_i=1$, the encoder flips all 2n−1 bits within both of the i-th row and the i-th column (noting that the element $u_{i,i}$ is only flipped once for each i where $x_i=1$). Further, when the predetermined range Δ is chosen according to equation (1) above, the expected number of times that the n-bit binary word will need to be selected and the elements of the binary array correspondingly bit-flipped, as above, until the binary array is found to meet the row-column Hamming weight condition is about 1/(1−p).

According to various examples, the row-column Hamming weight condition may be tested after each successive flipping operation. For example, the Hamming weights of the rows and columns may be computed and tested by the randomized bit-flip encoder 110 to determine if the row-column Hamming weight condition is met after bit flipping each individually selected redundancy-intersecting vector. In other examples, such as when a plurality of redundancy-intersecting vectors are selected, computing and testing the Hamming weights may be performed only after bit flipping all of the bits in all of the selected redundancy-intersecting vectors (e.g., all combined rows-columns where $x_i=1$).

In other examples, the bit-flip encoder 110 may be a deterministic bit-flip encoder 110. In particular, the bit-flip encoder 110 may be obtained by de-randomization of a randomized bit-flip encoder using a method of conditional probabilities, for example, such that the deterministic bit-flip encoder 110 meets the row-column Hamming weight condition in a deterministic (as opposed to a random) manner with respect to time. Moreover, the deterministic bit-flip encoder 110 may ensure meeting the row-column Hamming weight condition without needing to compute the row-column Hamming weight condition, according to various examples.

According to some examples, the deterministic bit-flip encoder 110 is configured to compute a difference parameter $Q_k(A)$ where A is the n×n binary array 104. The difference parameter $Q_k(A)$ is computed for each k from 1 to n. If the difference parameter $Q_k(A)$ is less than zero (i.e., $Q_k(A)<0$) for a given value of k, then the deterministic bit-flip encoder 110 is further configured to flip the bits in A that belong to a k-th redundancy-intersecting vector.

The difference parameter $Q_k(A)$ is given by equations (2) through (6) as $$Q_k(A) = \sum_{i=1}^{n} \left[ (-1)^{a_{i,k}} \left( \binom{n-k}{t_{i,k}} - \binom{n-k}{s_{i,k}} \right) + (-1)^{a_{k,i}} \left( \binom{n-k}{t^*_{i,k}} - \binom{n-k}{s^*_{i,k}} \right) \right] \quad (2)$$

$$\text{where } s_{i,k} = \frac{n}{2} - \Delta - 1 - \sum_{j=1}^{k-1} a_{i,j} \quad (3)$$

$$t_{i,k} = \frac{n}{2} + \Delta - \sum_{j=1}^{k-1} a_{i,j} \quad (4)$$

$$s^*_{i,k} = \frac{n}{2} - \Delta - 1 - \sum_{j=1}^{k-1} a_{j,i} \quad (5)$$

$$t^*_{i,k} = \frac{n}{2} + \Delta - \sum_{j=1}^{k-1} a_{j,i} \quad (6)$$

and where $a_{i,j}$ is a binary element of the binary array A at location (i,j), and each of $s_{i,k}$, $t_{i,k}$, $s^*_{i,k}$, and $t^*_{i,k}$ are variables indexed on i and k. In some examples, the k-th redundancy-intersecting vector includes a k-th row and a k-th column of the binary array A, and wherein the redundancy vector is a diagonal of the binary array A.

Referring again to FIG. 2, in some examples the bit-flip coding apparatus 100 further includes a decoder 120. The decoder 120 is configured to decode a selected bit provided by the bit-flip encoder 110 in the binary array 104. In particular, the decoder 120 decodes the selected bit of the binary array 104 previously encoded by the bit-flip encoder 110. According to various examples, the decoder 110 employs redundancy bits of the redundancy vector to decode a selected bit within the binary array 104. According to some examples, the decoder 120 may be used to decode all of the bits in the binary array 104 to recover the information bits of the data word 102.

In some examples, the decoder 120 computes an exclusive OR (XOR) of the selected bit and a pair of redundancy bits corresponding to the selected bit. In particular, in some examples, when a predetermined initial value of each of the redundancy bits of the redundancy vector is equal to zero, then the decoder 120 may be configured to implement equation (7a) given by $$u_{i,j} = a_{i,j} \oplus a_{i,i} \oplus a_{j,j} \quad (7a)$$

where $u_{i,j}$ is an element in an information bit array U at location (i, j) (e.g., the information data word 102), $a_{i,j}$ is an element in a binary array A at location (i, j) (e.g., the binary array 104 being decoded), $a_{i,i}$ and $a_{j,j}$ are respectively an i-th and j-th element of a major diagonal of the binary array A that represents the redundancy vector of the binary array A, and $\oplus$ is the XOR operation. A similar expression to equation (7a) may be readily devised to decode a binary array 104 in which the redundancy-intersecting vectors are generalized diagonals and the redundancy vector is either a row or a column of the binary array 104. For example, an expression given by equation (7b) as $$u_{i,j} = a_{i,j} \oplus a_{1,i-j+1} \quad (7b)$$

may be used for examples where the redundancy vector is a first row and i−j+1 is interpreted modulo n in a range 1, 2, ..., n.

In some examples of the principles described herein, a memory system is provided. The memory system may employ bit-flip coding to encode data stored in a memory array of the memory system, for example. Further, the memory system may employ the bit-flip decoding to decode previously encoded data when stored data in the memory system is accessed. In some examples, the memory system includes a resistive crossbar memory array to store the binary array (e.g., binary array 104) after bit-flip encoding. In some examples, unselected row lines and column lines of the resistive crossbar memory array are floating during a write operation to a resistive memory element within the resistive crossbar memory array.

Figure 4:
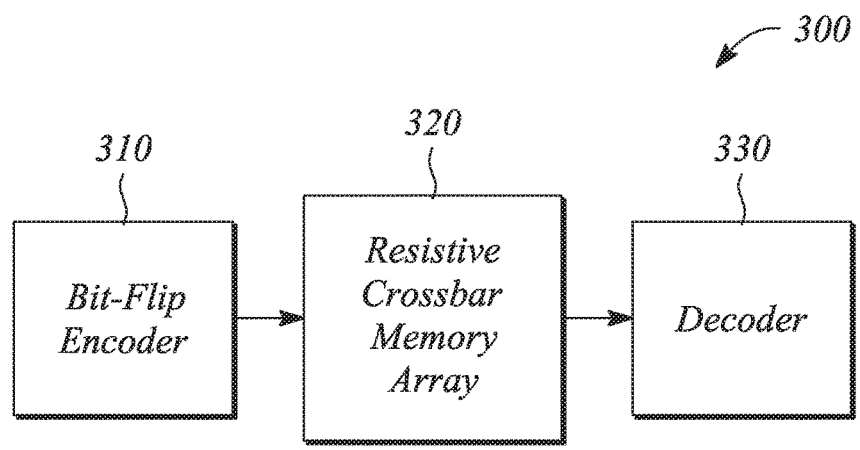
FIG. 4 illustrates a block diagram of a memory system employing bit-flip encoding, according to an example consistent with the principles described herein.

FIG. 4 illustrates a block diagram of a memory system 300 employing bit-flip encoding, according to an example consistent with the principles described herein. As illustrated, the memory system 300 includes a bit-flip encoder 310 to encode into a binary array having n rows and n columns. In various examples, the bit-flip encoder 310 is substantially similar to the bit-flip encoder 110 described above with respect to the bit-flip coding apparatus 100. In particular, the bit-flip encoder 310 is configured to encode the binary array by flipping bits in one or more redundancy-intersecting vectors of the binary array until a Hamming weight of each row and each column of the binary array is within a predetermined range Δ of n divided by two (i.e., until the row-column Hamming weight condition is met).

In some examples, the bit-flip encoder 310 is a randomized bit-flip encoder substantially similar to the randomized bit-flip encoder 110, described above. For example, the bit-flip encoder 310 may be configured to randomly select a redundancy-intersecting vector, to flip the bits of the randomly selected redundancy-intersecting vector, and further to test whether or not the row and column Hamming weights of the binary array are within a predetermined range Δ of n divided by two. In other examples, the bit-flip encoder 310 is a deterministic bit-flip encoder, substantially similar to the deterministic bit-flip encoder 110, described above with respect to the bit-flip coding apparatus 100. In particular, the deterministic bit-flip encoder may be configured to compute a difference parameter $Q_k(A)$ for each k from 1 to n and, if the difference parameter $Q_k(A)$ is less than zero, then to flip the bits in A that belong to a k-th redundancy-intersecting vector, where the A is the binary array. The difference parameter $Q_k(A)$ may be given by equations (2) through (6), for example.

According to various examples, the binary array to be encoded comprises an n-bit redundancy vector and n squared minus n information bits ($n^2-n$). The information bits are stored in array locations within the binary array outside of the locations corresponding to the n-bit redundancy vector, according to various examples. For example, the $n^2-n$ information bits may be provided by an input data word and may be placed in a substantially arbitrary but predetermined manner into the binary array without overwriting the n-bit redundancy vector. In some examples, the n-bit redundancy vector may be substantially similar to the redundancy vector described above with respect to binary array 104 and the bit-flip coding apparatus 100. Similarly, various redundancy-intersecting vectors defined on the binary array to include selected ones of the $n^2-n$ information bits along with a bit from the n-bit redundancy vector may be substantially similar to the redundancy-intersecting vector(s) described above with respect the binary array 104 and the bit-flip coding apparatus 100.

In particular, in some examples, then-hit redundancy vector is a diagonal of the binary array and each of the redundancy-intersecting vectors is a row and a corresponding column of the binary array (e.g., an i-th row and an i-th column). In other examples, then-hit redundancy vector is either a row or a column of the binary array and the redundancy-intersecting vectors are generalized diagonals of the binary array.

According to various examples, the memory system 300 further includes a resistive crossbar memory array 320. The resistive crossbar memory array 320 is configured to receive and store the encoded binary array encoded by the bit-flip encoder 310. The resistive crossbar memory array 320 may include any substantially resistive memory such as, but not limited to, memristors and ReRAM. For example, the resistive crossbar array 320 may be substantially similar to the resistive crossbar array 10 illustrated in FIGS. 1A-1B above.

In some examples, a resistive memory element of the resistive crossbar memory array 320 is selected by asserting (e.g., placing an appropriate voltage on) both of a row line and a column line of the resistive crossbar array 320. In particular, during a programming or 'write' operation, a voltage is produced across the selected resistive memory element by selectively driving the row line and the column line that connect to the selected resistive memory element. According to various examples, row lines and column lines that are not asserted are configured to float during the write operation in the resistive crossbar memory array 320. By 'float' it is meant by definition herein that non-asserted lines (i.e., row lines and column lines) are not driven or otherwise connected to any particular voltage (e.g., ground, a positive voltage, a negative voltage, etc.), but instead are allowed to float to whatever voltage may be present or developed thereon.

According to various examples, the memory system 300 further includes a decoder 330. The decoder 330 is configured to decode a selected encoded bit of the stored, encoded binary array using one or more corresponding encoded bits of the n-bit redundancy vector. In particular, the decoder 330 receives the selected encoded bit from the resistive crossbar array 320 for decoding. In some examples, the decoder 330 is substantially similar to the decoder 120 described above with respect to the bit-flip coding apparatus 100. For example, the decoder 330 may employ an XOR of the selected encoder bit and a bit or bits of the n-bit redundancy vector encoded by the bit-flip encoder 310. The decoder 330 may also receive the bit or bits of the encoded n-bit redundancy vector from the resistive crossbar memory array 320, according to various examples.

In other examples of the principles described herein, a method of bit-flip coding of a binary array is provided. The method of bit-flip coding may receive a plurality of information bits as an input data word and then encode those information bits as an encoded binary array for storage in a computer memory, for example. The computer memory that stores the encoded binary array may be a crossbar array of resistive memory elements (e.g., a resistive crossbar memory array), according to some examples. The encoded binary array or selected bits thereof may be decoded using information stored in the encoded binary array, according to various examples.

Figure 5:
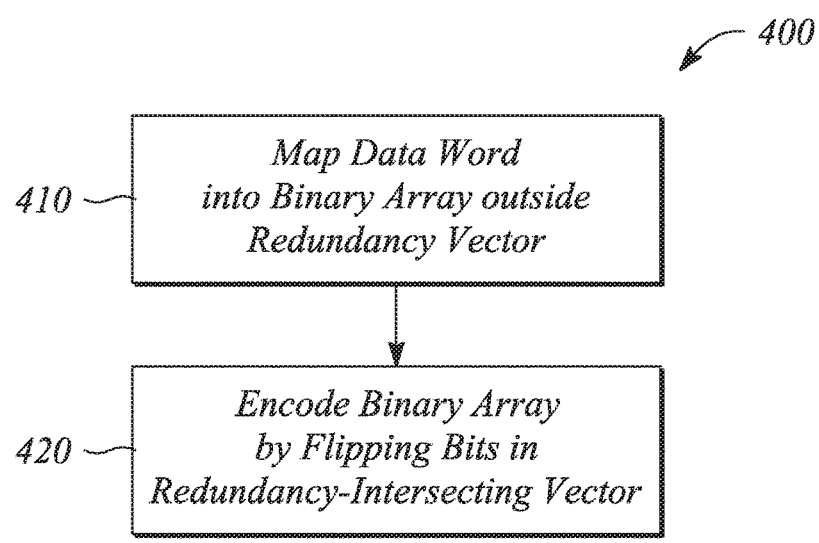
FIG. 5 illustrates a flow chart of a method of bit-flip coding of a binary array, according to an example consistent with the principles described herein.

FIG. 5 illustrates a flow chart of a method 400 of bit-flip coding of a binary array, according to an example consistent with the principles described herein. As illustrated, the method 400 of bit-flip coding includes mapping 410 a data word into the binary array outside of a redundancy vector. The binary array may be stored in non-transitory computer memory during mapping 410, for example. According to various examples, the binary array has n rows and n columns and the data word has n squared minus n information bits. Further, mapping 410 the data word places the information bits in locations in the binary array that are not occupied by n redundancy bits of the redundancy vector stored in the binary array.

In some examples, the binary array may be substantially similar to the binary array 104 described above with respect to the bit-flip coding apparatus 100. In some examples, the redundancy vector may be substantially similar to the redundancy vector of the bit-flip coding apparatus 100, described above. In particular, in some examples, the redundancy vector is a diagonal (e.g., a major diagonal) of the binary array. In other examples, the redundancy vector is either a row or a column of the binary array. Further, the n redundancy bits of the redundancy vector have a predetermined initial value (i.e., all 0's, all 1's, or a predetermine pattern of 1's and 0's).

As illustrated in FIG. 5, the method 400 of bit-flip coding further includes bit-flip encoding 420 the binary array comprising flipping bits in a (i.e., one or more) redundancy-intersecting vector of the binary array. Bit-flip encoding 420 continues flipping bits until Hamming weights of the rows and columns of the binary array are within a predetermined range Δ of n divided by two. In particular, bit-flip encoding 420 may produce substantially the same results as produced by the bit-flip encoder 110 described above with respect to the bit-flip coding apparatus 100, for example.

According to various examples, bit flipping of bit-flip encoding 420 employs a processor to perform bit flipping. For example, the processor may include, but is not limited to, a central processing unit (CPU), microprocessor, or similar processing unit programmed to perform bit-flip encoding 420. In other examples, a specialized circuit or system such as, but not limited to, an application specific integrated circuit (ASIC), field programmable gate array (FPGA) or similar circuits may be employed as the processor to perform bit-flip encoding 420.

According to some examples, the redundancy vector is stored in a major diagonal of the binary array and each redundancy-intersecting vector includes a row and a corresponding column of the binary array. The row may be an i-th row and the corresponding column may be an i-th column, for example. In other examples, the redundancy-intersecting vector is a generalized diagonal and the redundancy vector is either a row or a column of the binary array.

In some examples, the bit-flip encoding 420 is randomized bit-flip encoding. Randomized bit-flip encoding operates in a manner substantially similar to the randomized bit-flip encoder 110 of the bit-flip coding apparatus 100, described above. For example, randomized bit-flip encoding includes randomly selecting a row and a corresponding column of the binary array and flipping bits of the selected row and column. Randomized bit-flip encoding further includes computing the Hamming weights of the rows and columns of the binary array. If the computed row and column Hamming weights are within the predetermined range $\Delta$ of n divided by two, the randomized bit-flip encoding is terminated.

In other examples, the bit-flip encoding 420 is deterministic bit-flip encoding. Deterministic bit-flip encoding operates in a manner substantially similar to the deterministic bit-flip encoder 110 of the bit flip coding apparatus 100, described above. For example, deterministic bit-flip encoding computes a difference parameter $Q_k(A)$ for each k from 1 to n and, if the difference parameter $Q_k(A)$ is less than zero, flips the bits in A that belong to a k-th row and column, where A is the binary array. According to various examples, the difference parameter $Q_k(A)$ may be computed using equations (2) through (6), above.

According to some examples, the method 400 of bit-flip coding further includes storing the encoded binary array in an n×n crossbar array of resistive memory elements (i.e., an n×n resistive crossbar memory array). Storing the encoded binary array may include writing to a selected resistive memory element. According to various examples, writing to a selected resistive memory element includes selecting and driving a row line and a column line connected to the selected resistive memory element. Further during writing, all unselected row lines and column lines are floating during writing.

Thus, there have been described examples of a bit-flip coding apparatus, a memory system using bit flip encoding and a method of bit-flip coding a binary array. It should be understood that the above-described examples are merely illustrative of some of the many specific examples that represent the principles described herein. Clearly, those skilled in the art can readily devise numerous other arrangements without departing from the scope as defined by the following claims.

What is claimed is:

1. A memory coding apparatus comprising: a bit-flip encoder to receive an input data and encode the input data to produce encoded data by flipping bits in a redundancy-intersecting vector of a binary array having n rows and n columns until Hamming weights of each of the rows and columns of the binary array are within a predetermined range $\Delta$ of n divided by two, the bit-flip encoder to write the encoded data to a memory, wherein information bits of the input data to the bit-flip encoder are stored in locations within the binary array that are not occupied by n redundancy bits of a redundancy vector; and a decoder to decode the encoded data retrieved from the memory to recover the information bits of the input data; the memory including a resistive crossbar memory array to store the binary array after the bit-flip encoder flips the bits, wherein unselected row lines and column lines of the resistive crossbar memory array are floating during a write to a resistive memory element within the resistive crossbar memory array.

2. The memory coding apparatus of claim 1, wherein the redundancy-intersecting vector comprises both a row and a corresponding column of the binary array, the redundancy vector comprising a diagonal of the binary array and is intersected by the redundancy-intersecting vector.

3. The memory coding apparatus of claim 1, wherein the redundancy-intersecting vector comprises a generalized diagonal of the binary array, the redundancy vector comprising either a row or a column of the binary array and is intersected by the redundancy-intersecting vector.

4. The memory coding apparatus of claim 1, wherein the bit-flip encoder is a randomized bit-flip encoder, the randomized bit-flip encoder to randomly select the redundancy-intersecting vector, flip the bits of the randomly selected redundancy-intersecting vector, and compute Hamming weights of each of the rows and columns of the binary array to determine if the Hamming weights are within the predetermined range $\Delta$ of n divided by two.

5. The memory coding apparatus of claim 4, wherein the randomized bit-flip encoder further is to select a random, binary n-bit word having a uniform distribution, the redundancy-intersecting vector to be randomly selected corresponding to indices of bits of the selected binary n-bit word having a value of one.

6. The memory coding apparatus of claim 1, wherein the bit-flip encoder is a deterministic bit-flip encoder, the deterministic bit-flip encoder to compute a difference parameter $Q_k(A)$ for each k from 1 to n, and if the difference parameter $Q_k(A)$ is less than zero, then to flip the bits in A that belong to a k-th redundancy-intersecting vector, wherein the difference parameter $Q_k(A)$ is given by:

$$Q_k(A) = \sum_{i=1}^{n}\left[(-1)^{a_{i,k}}\left(\binom{n-k}{t_{i,k}} - \binom{n-k}{s_{i,k}}\right) + (-1)^{a_{k,i}}\left(\binom{n-k}{t^*_{i,k}} - \binom{n-k}{s^*_{i,k}}\right)\right]$$

where $s_{i,k} = \frac{n}{2} - \Delta - 1 - \sum_{j=1}^{k-1} a_{i,j}$ $t_{i,k} = \frac{n}{2} + \Delta - \sum_{j=1}^{k-1} a_{i,j}$ $s^*_{i,k} = \frac{n}{2} - \Delta - 1 - \sum_{j=1}^{k-1} a_{j,i}$ $t^*_{i,k} = \frac{n}{2} + \Delta - \sum_{j=1}^{k-1} a_{j,i}$ and where A is the binary array, $a_{i,j}$ is a binary element of the binary array A at location (i,j), and each of $s_{i,k}$, $t_{i,k}$, $s^*_{i,k}$, and $t^*_{i,k}$ are variables indexed on i and k.

7. The memory coding apparatus of claim 6, wherein the k-th redundancy-intersecting vector includes a k-th row and a k-th column of the binary array A, and wherein the redundancy vector is a diagonal of the binary array A.

8. The memory coding apparatus of claim 1, wherein the decoder is to decode a selected bit of the encoded data retrieved from the memory, the decoder to determine both an exclusive OR (XOR) of the selected bit and a pair of redundancy bits corresponding to the selected bit, wherein a predetermined value of each of the n redundancy bits of the redundancy vector is each equal to zero prior to the bit-flip encoder flipping the bits.

9. The memory coding apparatus of claim 1, wherein the flipping of the bits in the redundancy-intersecting vector is to reduce introduction of errors when writing data to the memory.

10. The memory coding apparatus of claim 9, wherein the memory includes resistive memory elements, and wherein the flipping of the bits in the redundancy-intersecting vector is to reduce introduction of errors caused by unselected resistive memory elements connected to floating unselected row and column lines when writing a data bit to a selected resistive memory element of the memory.

11. The memory coding apparatus of claim 10, wherein the flipping of the bits in the redundancy-intersecting vector is to reduce the introduction of errors caused by interference from a resistor network formed by the unselected resistive memory elements when writing the data bit to the selected resistive memory element of the memory.

12. The memory coding apparatus of claim 9, wherein the memory includes resistive memory elements, and wherein the flipping of the bits in the redundancy-intersecting vector is to reduce introduction of errors caused by unselected resistive memory elements turning on when writing a data bit to a selected resistive memory element of the memory.

13. A memory system employing bit flip coding comprising:
- a bit-flip encoder to receive an input data and to place information bits of the input data into a binary array, the bit-flip encoder to encode the binary array having n rows and n columns by flipping bits in a redundancy-intersecting vector of the binary array until Hamming weights of the rows and columns of the binary array are within a predetermined range Δ of n divided by two, the binary array comprising an n-bit redundancy vector and n squared minus n information bits, the information bits being stored in array locations of the binary array outside of the n-bit redundancy vector;
- a resistive crossbar memory to receive and store the binary array encoded by the bit-flip encoder; and
- a decoder to retrieve a selected encoded bit of the stored, encoded binary array from the resistive crossbar memory, and to decode the selected encoded bit using a corresponding encoded bit of the n-bit redundancy vector.

14. The memory system of claim 13, wherein the n-bit redundancy vector is a diagonal of the binary array, the redundancy-intersecting vector being a row and a corresponding column of the binary array, the redundancy-intersecting vector intersecting the n-bit redundancy vector, and wherein the bit-flip encoder is a randomized bit-flip encoder, the randomized bit-flip encoder to randomly select the redundancy-intersecting vector, flip the bits of the randomly selected redundancy-intersecting vector, and test whether or not the Hamming weights of the binary array are within the predetermined range Δ of n divided by two.

15. The memory system of claim 13, wherein the n-bit redundancy vector is a diagonal of the binary array, the redundancy-intersecting vector being a row and a corresponding column of the binary array, the redundancy-intersecting vector intersecting the n-bit redundancy vector, and wherein the bit-flip encoder is a deterministic bit-flip encoder, the deterministic bit-flip encoder to compute a difference parameter $Q_k(A)$ for each k from 1 to n and if the difference parameter $Q_k(A)$ is less than zero, then to flip the bits in A that belong to a k-th redundancy-intersecting vector, wherein the difference parameter $Q_k(A)$ is given by:

$$Q_k(A) = \sum_{i=1}^{n} \left[ (-1)^{a_{i,k}} \left( \binom{n-k}{t_{i,k}} - \binom{n-k}{s_{i,k}} \right) + (-1)^{a_{k,i}} \left( \binom{n-k}{t^*_{i,k}} - \binom{n-k}{s^*_{i,k}} \right) \right]$$

where $s_{i,k} = \frac{n}{2} - \Delta - 1 - \sum_{j=1}^{k-1} a_{i,j}$ $t_{i,k} = \frac{n}{2} + \Delta - \sum_{j=1}^{k-1} a_{i,j}$ $s^*_{i,k} = \frac{n}{2} - \Delta - 1 - \sum_{j=1}^{k-1} a_{j,i}$ $t^*_{i,k} = \frac{n}{2} + \Delta - \sum_{j=1}^{k-1} a_{j,i}$ and where A is the binary array, $a_{i,j}$ is a binary element of the binary array A at location (i,j), and each of $s_{i,k}$, $t_{i,k}$, $s^*_{i,k}$, and $t^*_{i,k}$ are variables indexed on i and k.

16. The memory system of claim 13, wherein the flipping of the bits in the redundancy-intersecting vector is to reduce introduction of errors when writing data to the resistive crossbar memory.

17. A method comprising: receiving an input data to write to a memory; mapping the input data into a binary array stored in non-transitory computer memory, the binary array having n rows and n columns, the input data having n squared minus n information bits; bit-flip encoding the binary array comprising flipping bits in a redundancy-intersecting vector of the binary array using a processor until Hamming weights of the rows and the columns of the binary array are within a predetermined range Δ of n divided by two, wherein the mapping of the input data places the information bits in locations in the binary array that are not occupied by n redundancy bits of a redundancy vector stored in the binary array, writing the bit-flip encoded binary array to the memory; storing the encoded binary array in an n×n crossbar array of resistive memory elements, wherein storing comprises writing to a selected resistive memory element of the n×n crossbar array, the writing comprising selecting and driving a row line and a column line of the n×n crossbar array connected to the selected resistive memory element, wherein all unselected row lines and column lines of the n×n crossbar array are floating during the writing; and retrieving a selected encoded bit of the bit-flip encoded binary array from the memory, and decoding, using a decoder, the selected encoded bit.

18. The method of claim 17, wherein the redundancy vector is stored in a major diagonal of the binary array, the redundancy-intersecting vector comprising a row and a corresponding column of the binary array, and either
wherein the bit-flip encoding is a randomized bit-flip encoding comprising:

randomly selecting a row and a corresponding column of the binary array; flipping bits of the selected row and column; and computing the Hamming weights of all of the rows and columns of the binary array, wherein if the computed Hamming weights are within the predetermined range Δ of n divided by two, the randomized bit-flip encoding is terminated, or wherein the bit-flip encoding is a deterministic bit-flip encoding comprising:

computing a difference parameter $Q_k(A)$ for each k from 1 to n and if the difference parameter $Q_k(A)$ is less than zero, flipping the bits in A that belong to a k-th row and column, wherein A is the binary array.

* * * * *